US012772906B2

(12) United States Patent
Jin

(10) Patent No.: US 12,772,906 B2
(45) Date of Patent: Oct. 20, 2026

(54) PACKAGING STRUCTURE AND PACKAGING METHOD

(71) Applicant: Semiconductor Manufacturing International (Shanghai) Corporation, Shanghai (CN)

(72) Inventor: Jisong Jin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 449 days.

(21) Appl. No.: 18/374,140

(22) Filed: Sep. 28, 2023

(65) Prior Publication Data

US 2024/0178186 A1 May 30, 2024

(30) Foreign Application Priority Data

Nov. 24, 2022 (CN) ........................ 202211482297.0

(51) Int. Cl.

| | |
|---|---|
| ***H10W 70/05*** | (2026.01) |
| ***H10W 70/60*** | (2026.01) |
| ***H10W 70/685*** | (2026.01) |
| ***H10W 90/00*** | (2026.01) |

(52) U.S. Cl.

CPC ......... *H10W 90/00* (2026.01); *H10W 70/093* (2026.01); *H10W 70/095* (2026.01); *H10W 70/611* (2026.01); *H10W 70/685* (2026.01); *H10W 90/701* (2026.01); *H10W 90/792* (2026.01)

(58) Field of Classification Search

CPC ............ H01L 25/0652; H01L 21/4853; H01L 21/486; H01L 23/49816; H01L 23/5383; H01L 24/08; H01L 25/50; H01L 2224/08145; H01L 2225/065; H01L 2924/381; H01L 23/5389; H01L 24/16; H01L 23/5386; H01L 21/4814; H01L 23/3107; H01L 25/0655

See application file for complete search history.

(56) References Cited

U.S. PATENT DOCUMENTS

2019/0115319 A1* 4/2019 Hiner ...................... H01L 25/50
2024/0120316 A1* 4/2024 Ho ...................... H01L 25/0657

* cited by examiner

*Primary Examiner* — Elias Ullah
(74) *Attorney, Agent, or Firm* — Crowell & Moring LLP

(57) ABSTRACT

A packaging structure and a packaging method are provided. The packaging method includes: providing a carrier; providing a plurality of device chips, a device chip including a first side and a second side, and a first interconnection structure being formed on the first side; attaching the plurality of device chips to the carrier; forming a first packaging layer covering a side wall of the device chip and filling between device chips on the carrier; providing an interconnect chip, a second interconnection structure being formed on the interconnect chip, and the second interconnection structure exposing a surface of the interconnect chip; bonding the interconnect chip to the device chip and the first packaging layer, the second interconnection structure of the interconnect chip facing and contacting the first interconnection structure of the device chip; and forming a second packaging layer covering the interconnect chip on the first packaging layer.

13 Claims, 3 Drawing Sheets

PACKAGING STRUCTURE AND PACKAGING METHOD

CROSS REFERENCE TO RELATED APPLICATIONS

This application is based on and claims priority to Chinese patent Application No. 202211482297.0, filed Nov. 24, 2022, the entire content of which is incorporated herein by reference.

TECHNICAL FIELD

The disclosure relates to the technical field of semiconductor packaging, and in particular to a packaging structure and a packaging method.

BACKGROUND

For monolithic chip sizes, conventional chip manufacturing technologies are being pushed to their limits. However, applications are hungry for the ability to use the latest technology to achieve large size integrated circuits, and it is a great challenge to realize high-speed and small-volume interconnection between chips.

One current solution is to use smaller integrated circuits with Si bridge chips embedded in the silicon substrate to realize the interconnection between chips through the Si bridge chip, thereby providing heterogeneous chip packaging.

However, the interconnection performance between chips still needs to be improved.

SUMMARY

The disclosure relates to a packaging structure and a packaging method to improve the interconnection performance between chips.

In an aspect of the disclosure, a packaging structure is provided. The packaging structure may include:

- a plurality of device chips, where a device chip of the plurality of device chips includes a first side and a second side facing away from the first side, and a first interconnection structure being formed on the first side of the device chip; a first packaging layer, covering a side wall of the device chip and filling between device chips of the plurality of device chips, the first packaging layer exposing the first side of the device chip; an interconnect chip, bonded to the device chip and the first packaging layer, a second interconnection structure being formed on the interconnect chip, the second interconnection structure being exposed from a surface of the interconnect chip, and the second interconnection structure of the interconnect chip facing and contacting the first interconnection structure of the device chip; and a second packaging layer, located on the first packaging layer and covering the interconnect chip.

In an implementation, the first side is a front side of the device chip, and the second side is a back side of the device chip.

In an implementation, the packaging structure further includes: a via interconnection structure, running through the second packaging layer and electrically connected to the device chip.

In an implementation, a number of the first interconnection structures in the device chip is plural; and the via interconnection structure runs through the second packaging layer on a top of the first interconnection structure exposed by the interconnect chip and contacts the first interconnection structure.

In an implementation, the packaging structure further includes: a connection layer, located in the second packaging layer on a top of the via interconnection structure and extending along a direction parallel to the second packaging layer; and a conductive bump, located on the connection layer.

In an implementation, the packaging structure further includes: a redistribution structure, located on the second packaging layer and the via interconnection structure; and a conductive bump, located on the redistribution structure.

In an implementation, the redistribution structure includes one or more redistribution layers.

In an implementation, a first dielectric layer is formed on the first side of the device chip, and a first top layer line is formed in the first dielectric layer; and the first interconnection structure runs through the first dielectric layer above the first top layer line and contacts the first top layer line; and alternatively, a first dielectric layer is formed on the first side of the device chip, and a first pad is formed in the first dielectric layer; and the first interconnection structure is located in the first dielectric layer on a top of the first pad.

In an implementation, a second dielectric layer is formed on the interconnect chip, and a second top layer line is formed in the second dielectric layer; and the second interconnection structure runs through the second dielectric layer above the second top layer line and contacts the second top layer line; and alternatively, a second dielectric layer is formed on the interconnect chip, and a second pad is formed in the second dielectric layer; and the second inter connection structure is located in the second dielectric layer on a top of the second pad.

In an implementation, a material of the first interconnection structure includes: any one or more of copper, titanium, aluminum, gold, nickel, iron, tin, silver, zinc or chromium; and a material of the second interconnection structure includes: any one or more of copper, titanium, aluminum, gold, nickel, iron, tin, silver, zinc or chromium.

In another aspect of the disclosure, a packaging method is provided. The packaging method may including:

- providing a carrier; providing a plurality of device chips, a device chip including a first side and a second side facing away from the first side, the device chip being one of the plurality of device chips, and a first interconnection structure being formed on the first side of the device chip; attaching the plurality of device chips to the carrier, the second side of the device chip facing the carrier; forming a first packaging layer covering a side wall of the device chip and filling between device chips of the plurality of device chips on the carrier, the first packaging layer exposing the first side of the device chip; providing an interconnect chip, a second interconnection structure being formed on the interconnect chip, and the second interconnection structure exposing a surface of the interconnect chip; bonding the interconnect chip to the device chip and the first packaging layer, the second interconnection structure of the interconnect chip facing and contacting the first interconnection structure of the device chip; and forming a second packaging layer covering the interconnect chip on the first packaging layer.

In an implementation, the first side is a front side of the device chip, and the second side is a back side of the device chip.

In an implementation, after forming the second packaging layer, the packaging method further includes: forming a via interconnection structure running through the second packaging layer and electrically connected to the device chip.

In an implementation, a number of the first interconnection structures in the device chip is plural; and in the step of forming the via interconnection structure, the via interconnection structure runs through the second packaging layer on a top of the first interconnection structure exposed by the interconnect chip and contacts the first interconnection structure.

In an implementation, in the step of forming the via interconnection structure, a connection layer is further formed in the second packaging layer on a top of the via interconnection structure, the connection layer extending along a direction parallel to the second packaging layer; and the packaging method further includes: forming, after forming the via interconnection structure and the connection layer, a conductive bump on the connection layer.

In an implementation, after forming the via interconnection structure, the packaging method further includes: forming a redistribution structure on the second packaging layer and the via interconnection structure; and forming a conductive bump on the redistribution structure.

In an implementation, the packaging method further includes: removing, after forming the second packaging layer, the carrier.

Compared with the prior art, the disclosure has the following advantages.

In the packaging structure provided by form of the disclosure, the interconnect chip is bonded to the device chip and the first packaging layer. The second interconnection structure is formed on the interconnect chip, the second interconnection structure is exposed from the surface of the interconnect chip, and the second interconnection structure of the interconnect chip faces and contacts the first interconnection structure of the adjacent device chip, so that the device chips are electrically connected through the interconnect chip. Moreover, the second interconnection structure of the interconnect chip faces and contacts the first interconnection structure of the adjacent device chip, which is beneficial to reduce the distance between the interconnect chip and the device chip, thereby being beneficial to reduce the pitch between interconnect ports of the interconnect chip and the device chip and accordingly increasing the interconnection density and communication speed between the interconnect chip and the device chip.

In the packaging method provided by the form of the disclosure, the interconnect chip is bonded to the device chip and the first packaging layer, and the second interconnection structure of the interconnect chip faces and contacts the first interconnection structure of the adjacent device chip, so that the device chips are electrically connected through the interconnect chip. Moreover, the second interconnection structure of the interconnect chip faces and contacts the first interconnection structure of the adjacent device chip, which is beneficial to reduce the distance between the interconnect chip and the device chip, thereby being beneficial to reduce the pitch between interconnect ports of the interconnect chip and the device chip and accordingly increasing the interconnection density and communication speed between the interconnect chip and the device chip. In addition, in the form of the disclosure, the process steps of attaching the device chip, forming the first packaging layer, bonding the interconnect chip and forming the second packaging layer are all performed on the carrier, so that the process steps of the form of the disclosure are simple. Moreover, only one carrier is needed, which is beneficial to save the process cost.

DETAILED DESCRIPTION

The disclosure provides a packaging structure, including: a plurality of device chips, the device chip including a first side and a second side facing away from each other, and a first interconnection structure being formed on the first side; a first packaging layer, covering a side wall of the chip and filling between the device chips, the first packaging layer exposing the first side of the device chip; an interconnect chip, bonded to the device chip and the first packaging layer, a second interconnection structure being formed on the interconnect chip, the second interconnection structure being exposed from a surface of the interconnect chip, and the second interconnection structure of the interconnect chip facing and contacting the first interconnection structure of the adjacent device chip; and a second packaging layer, located on the first packaging layer and covering the interconnect chip.

In the packaging structure provided by form of the disclosure, the interconnect chip is bonded to the device chip and the first packaging layer. The second interconnection structure is formed on the interconnect chip, the second interconnection structure is exposed from the surface of the interconnect chip, and the second interconnection structure of the interconnect chip faces and contacts the first interconnection structure of the adjacent device chip, so that the device chips are electrically connected through the interconnect chip. Moreover, the second interconnection structure of the interconnect chip faces and contacts the first interconnection structure of the adjacent device chip, which is beneficial to reduce the distance between the interconnect chip and the device chip, thereby being beneficial to reduce the pitch between interconnect ports of the interconnect chip and the device chip and accordingly increasing the interconnection density and communication speed between the interconnect chip and the device chip.

Figure 1:
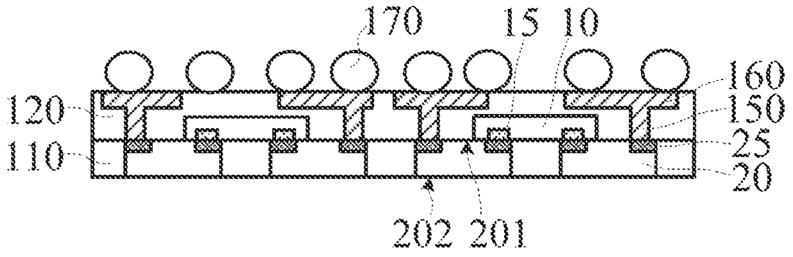
FIG. 1 is a schematic structural diagram of a packaging structure according to a form of the disclosure.

To make the foregoing objectives, features, and advantages of the disclosure more apparent and easier to understand, exemplary forms of the disclosure are described in detail below with reference to the accompanying drawings. FIG. 1 shows a schematic structural diagram of a packaging structure according to a form of the disclosure.

As shown in FIG. 1, in this form, the packaging structure includes: a plurality of device chips 20, the device chip 20 including a first side 201 and a second side 202 facing away from each other, and a first interconnection structure 25 being formed on the first side 201; a first packaging layer 110, covering a side wall of the chip 20 and filling between the device chips 20, the first packaging layer 110 exposing the first side 201 of the device chip 20; an interconnect chip 10, bonded to the device chip 20 and the first packaging layer 110, a second interconnection structure 15 being formed on the interconnect chip 10, the second interconnection structure 15 being exposed from a surface of the interconnect chip 10, and the second interconnection structure 15 of the interconnect chip 10 facing and contacting the first interconnection structure 25 of the adjacent device chip 20; and a second packaging layer 120, located on the first packaging layer 110 and covering the interconnect chip 10.

The plurality of device chips 20 are configured to be packaged together and realize electrical connection with each other, thereby forming the corresponding packaging structure and further realizing specific functions.

In a specific implementation, types of the plurality of device chips 20 may be the same or different. When the types of the device chips 20 are different, heterogeneous integration can be achieved.

In an example, the plurality of device chips 20 include a first chip (not shown) and a second chip (not shown). The types of the first chip and the second chip are different to realize different functions.

In an example, the first chip is a high bandwidth memory (HBM) chip. The use of the HBM chip is beneficial to meet the requirements of higher information transmission speed.

In an example, the second chip is a logic chip for logic control of the first chip.

Specifically, the second chip may be a CPU chip, a GPU chip or an SoC chip.

In this form, the device chip 20 includes a first side 201 and a second side 202 facing away from each other.

In this form, the first side 201 is a front side of the device chip 20, and the second side 202 is a back side of the device chip 20.

In this form, the first side 201 is a side of the device chip 20 for bonding.

In this form, the front side of the chip is a side facing the device in the chip, and the back side of the chip is a side facing away from the device in the chip.

The first interconnection structure 25 is used as an external electrode of the device chip 20 to realize electrical connection between the device chip 20 and an external circuit or other interconnection structures. In an example, the first interconnection structure 25 is configured to realize electrical connection between the device chip 20 and the second interconnection structure 15.

The first interconnection structure 25 is exposed from the first side 201 of the device chip 20 so as to realize electrical connection with an external circuit or other interconnection structures.

Specifically, In an example, a first dielectric layer (not shown) is formed on the first side 201 of the device chip 20, and a first top layer line (not shown) is formed in the first dielectric layer. The first interconnection structure 25 runs through the first dielectric layer above the first top layer line and contacts the first top layer line.

In this form, the first interconnection structure 25 may be a conductive plug running through the first dielectric layer above the first top layer line, one end of the conductive plug contacts the first top layer line, and the other end is exposed from the first side 201 of the device chip 20, which facilitates bonding to the second interconnection structure 15.

Alternatively, in other forms, a first dielectric layer is formed on the first side of the device chip, and a first pad is formed in the first dielectric layer; and the first interconnection structure is located in the first dielectric layer on a top of the first pad.

In some other forms, based on the actual process demands, the first interconnection structure may also be other types of interconnection structures in the device chip. For example, the first interconnection structure may be the first pad.

In this form, a number of the first interconnection structures 25 in the device chip 20 is plural, so that in addition to bonding between the first interconnection structure 25 and the second interconnect structure 15, electrical connection between the first interconnection structure 25 and other interconnection structures can also be realized.

In an example, a material of the first interconnection structure 25 is a conductive material. More specifically, the material of the first interconnection structure 25 is a metal, including any one or more of copper, titanium, aluminum, gold, nickel, iron, tin, silver, zinc or chromium, which is beneficial to obtain good electrical conductivity.

In an example, the material of the first interconnection structure 25 is copper. Copper expands when heated, thereby facilitating contact and bonding with the second interconnection structure 15.

The first packaging layer 110 is configured to realize packaging and integration between the plurality of device chips 20. The first packaging layer 110 can also play roles of insulation, sealing and moisture prevention, which is beneficial to improve the reliability of the packaging structure.

The first packaging layer 110 exposes the first side 201 of the device chip 20, so as to realize electrical connection between the device chip 20 and an external circuit or other interconnection structures. More specifically, the first packaging layer 110 exposes the first interconnection structure 25, so as to realize bonding between the first interconnection structure 25 and the second interconnection structure 15 and electrical connection between the first interconnection structure 25 and other interconnection structures.

In a form, a material of the first packaging layer 110 is a molding material, for example, epoxy resin. The epoxy resin has the advantages of low shrinkage, good binding property, good corrosion resistance, excellent electrical properties, low cost, etc. In other forms, the first packaging layer may be made of other appropriate packaging materials.

The interconnect chip 10 is used as a bridge to realize interconnection between the device chip 20 and the device chip 20. In this form, the plurality of device chips 20 include different types of device chips 20, so that the interconnect chip 10 can provide heterogeneous chip packaging.

In the packaging structure provided by this form, the interconnect chip 10 is bonded to the device chip 20 and the first packaging layer 110. The second interconnection structure 15 is formed on the interconnect chip 10, the second interconnection structure 15 is exposed from the surface of the interconnect chip 10, and the second interconnection structure 15 of the interconnect chip 10 faces and contacts the first interconnection structure 25 of the adjacent device chip 20, so that the device chips 20 are electrically connected through the interconnect chip 10. Moreover, the second interconnection structure 15 of the interconnect chip 10 faces and contacts the first interconnection structure 25 of the adjacent device chip 20, which is beneficial to reduce the distance between the interconnect chip 10 and the device chip 20, thereby being beneficial to reduce the pitch between interconnect ports of the interconnect chip 10 and the device chip 20 and accordingly increasing the interconnection density and communication speed between the interconnect chip 10 and the device chip 20.

Specifically, one or more layers of lines are formed in the interconnect chip 10.

The second interconnection structure 15 is used as an external electrode of the interconnect chip 10 to realize electrical connection between the interconnect chip 10 and an external circuit or other interconnection structures. In an example, the second interconnection structure 15 is configured to realize electrical connection between the interconnect chip 10 and the device chip 20.

The second interconnection structure 15 is exposed from the surface of the interconnect chip 10, so as to realize electrical connection with an external circuit or other interconnection structures.

In this form, the second interconnection structure 15 of the interconnect chip 10 faces and contacts the first interconnection structure 25 of the adjacent device chip 20, so that the electrical connection between the first interconnection structure 25 and the second first interconnection structure 15 is realized without other interconnection structures, which is beneficial to reduce the distance between the interconnect chip 10 and the device chip 20.

Specifically, the number of the second interconnection structures 15 of the interconnect chip 10 is at least two, one of the second interconnection structures 15 faces and contacts the first interconnection structure 25 of one of the device chips 20, and the other second interconnection structure 15 faces and contacts the first interconnection structure 25 of one adjacent device chip 20, thereby realizing electrical connection between the adjacent device chips 20.

In this form, a second dielectric layer (not shown) is formed on the interconnect chip 10, and a second top layer line (not shown) is formed in the second dielectric layer; and the second interconnection structure 15 runs through the second dielectric layer above the second top layer line and contacts the second top layer line.

In this form, the second interconnection structure 15 may be a conductive plug running through the second dielectric layer above the second top layer line, one end of the conductive plug contacts the second top layer line, and the other end is exposed from the interconnect chip 10, which facilitates bonding to the first interconnection structure 25 and realizes electrical connection.

Alternatively, in other forms, a second dielectric layer is formed on the interconnect chip, and a second pad is formed in the second dielectric layer; and the second interconnection structure is located in the second dielectric layer on a top of the second pad.

In some other forms, based on the actual process demands, the second interconnection structure may also be other types of interconnection structures in the interconnect chip. For example, the second interconnection structure may be the second pad.

In an example, a material of the second interconnection structure 15 is a metal, including any one or more of copper, titanium, aluminum, gold, nickel, iron, tin, silver, zinc or chromium, which is beneficial to obtain good electrical conductivity.

In an example, the material of the second interconnection structure 15 is copper. Copper expands when heated, thereby facilitating contact and bonding with the first interconnection structure 25.

In this form, the second interconnection structure 15 of the interconnect chip 10 faces and is bonded to the first interconnection structure 25 of the device chip 20, and the second dielectric layer of the interconnect chip 10 faces and is bonded to the first packaging layer and the first dielectric layer of the device chip 20, thereby realizing hybrid bonding. With the hybrid bonding, there is no need for micro bumps (bumps), which can further reduce the interconnection pitch of bonding, thereby realizing high-density integration.

The second packaging layer 120 is configured to realize packaging and integration between the interconnect chip 10, and the device chip 20 and first packaging layer 110, and can also play roles of insulation, sealing and moisture prevention, which is beneficial to improve the reliability of the packaging structure.

In a form, a material of the second packaging layer 120 is a molding material, for example, epoxy resin. The epoxy resin has the advantages of low shrinkage, good binding property, good corrosion resistance, excellent electrical properties, low cost, etc. In other forms, the second packaging layer may be made of other appropriate packaging materials. It should be noted that in this form, the packaging structure further includes: a via interconnection structure 150, running through the second packaging layer 120 and electrically connected to the device chip 20.

The via interconnection structure 150 is configured to realize electrical connection between the device chip 20 and an external circuit or other interconnection structures.

In this form, the via interconnection structure 150 is a through molding via (TMV).

In this form, the number of the first interconnection structures 25 in the device chip 20 is plural; and the via interconnection structure 150 runs through the second packaging layer 120 on a top of the first interconnection structure 25 exposed by the interconnect chip 10 and contacts the first interconnection structure 25.

In this form, a material of the via interconnection structure 150 is a conductive material. More specifically, the material of the via interconnection structure 150 is a metal, including any one or more of copper, titanium, aluminum, gold, nickel, iron, tin, silver, zinc or chromium, which is beneficial to obtain good electrical conductivity.

In this form, the packaging structure further includes: a connection layer 160, located in the second packaging layer 120 on a top of the via interconnection structure 150 and extending along a direction parallel to the second packaging layer 120; and a conductive bump 170, located on the connection layer 160.

In this form, the connection layer 160 is configured to realize electrical connection between the via interconnection structure 150 and an external circuit or other interconnection structures thereby realizing electrical connection between the device chip 20 and the external circuit through the via interconnection structure 150. In this form, the connection layer 160 is also configured to provide a process platform for the formation of the conductive bump 170.

In an example, the connection layer 160 and the via interconnection structure 150 are formed in the same step, and the connection layer 160 and the via interconnection structure 150 form an integrated structure, which is beneficial to reduce contact resistance between the connection layer 160 and the via interconnection structure 150 and improve the electrical connection performance of the packaging structure.

More specifically, a material of the connection layer 160 is a metal, including any one or more of copper, titanium, aluminum, gold, nickel, iron, tin, silver, zinc or chromium.

The conductive bump 170 is configured to realize electrical connection between the connection layer 160 and an external circuit (e.g., a substrate).

In this form, the conductive bump 170 is a solder ball. In an example, a material of the solder ball includes tin.

Specifically, the solder ball is Controlled Collapse Chip Connection (C4), and has excellent electrical properties and thermal characteristics. Moreover, in a case of the same pitch between the solder balls, the I/O number can be very high, and not limited by the size of the connection layer 160. Besides, the solder ball is suitable for mass production, and the size and weight can be greatly reduced.

In other forms, the packaging structure further includes: a redistribution structure, located on the second packaging layer and the via interconnection structure; and a conductive bump, located on the redistribution structure.

The redistribution structure is configured to realize electrical connection between the via interconnection structure and an external circuit or other interconnection structures, thereby realizing electrical connection between the chip and the external circuit through the via interconnection structure. In addition, the redistribution structure can also redistribute connecting terminals of the via interconnection structure, so that the conductive bumps, of which density and positions satisfy the process demands, can be formed. In this form, the redistribution structure is also configured to provide a process platform for the formation of the conductive bump.

Specifically, the redistribution structure may include one or more redistribution layers.

Specifically, a material of the redistribution structure is a conductive material. More specifically, the material of the redistribution structure is a metal, including any one or more of copper, titanium, aluminum, gold, nickel, iron, tin, silver, zinc or chromium.

Accordingly, the disclosure further provides a packaging method. FIG. 2 to FIG. 11 are schematic structural diagrams corresponding to steps of a packaging method according to a form of the disclosure.

Figure 2:
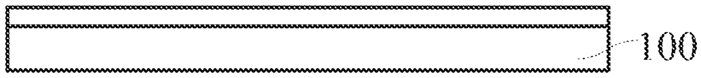
FIG. 2 to FIG. 11 are schematic structural diagrams corresponding to steps of a packaging method according to a form of the disclosure.

The packaging method provided by this form will be described in detail below with reference to the accompanying drawings. Referring to FIG. 2, a carrier 100 is provided.

The carrier 100 is configured to provide a process operation platform for subsequent packaging steps. The carrier 100 is also configured to provide carrying and supporting functions for subsequent process steps.

In this form, the carrier 100 is a carrier wafer. In other forms, the carrier may also be other types of bases. In this form, a material of the carrier 100 may include one or more of silicon, glass, silicon oxide and aluminum oxide.

Figure 3:
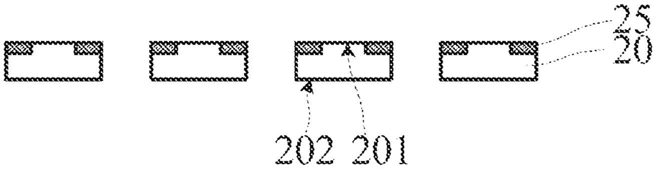

Referring to FIG. 3, a plurality of device chips 20 are provided. The device chip 20 includes a first side 201 and a second side 202 facing away from each other, and a first interconnection structure 25 is formed on the first side 201.

The plurality of device chips 20 are configured to be packaged together subsequently and realize electrical connection with each other, thereby realizing specific functions.

In a specific implementation, types of the plurality of device chips 20 may be the same or different. When the types of the device chips 20 are different, heterogeneous integration can be achieved.

In an example, the plurality of device chips 20 include a first chip (not shown) and a second chip (not shown). The types of the first chip and the second chip are different to realize different functions.

In an example, the first chip is a high bandwidth memory (HBM) chip. The use of the HBM chip is beneficial to meet the requirements of higher information transmission speed.

In an example, the second chip is a logic chip for logic control of the first chip. Specifically, the second chip may be a CPU chip, a GPU chip or an SoC chip.

The device chip 20 includes the first side 201 and the second side 202 facing away from each other.

In this form, the first side 201 is a front side of the device chip 20, and the second side 202 is a back side of the device chip 20.

In this form, the first side 201 is a side of the device chip 20 for bonding.

In this form, the front side of the chip is a side facing the device in the chip, and the back side of the chip is a side facing away from the device in the chip.

The first interconnection structure 25 is used as an external electrode of the device chip 20 to realize electrical connection between the device chip 20 and an external circuit or other interconnection structures. The first interconnection structure 25 is exposed from the first side 201 of the device chip 20 so as to realize electrical connection with an external circuit or other interconnection structures.

In an example, a material of the first interconnection structure 25 is a conductive material. More specifically, the material of the first interconnection structure 25 is a metal, including any one or more of copper, titanium, aluminum, gold, nickel, iron, tin, silver, zinc or chromium, which is beneficial to obtain good electrical conductivity.

Figure 4:
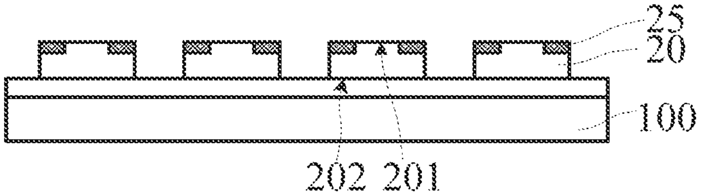

Referring to FIG. 4, the plurality of device chips 20 are attached to the carrier 100. The second side 202 of the device chip 20 faces the carrier 100.

The plurality of device chips 20 are attached to the carrier 100, thereby facilitating subsequent packaging and integration between the plurality of device chips 20 and subsequent electrical connection between the device chips 20 through the interconnect chip.

The second side 202 of the device chip 20 faces the carrier 100, so that the first side 201 of the device chip 20 faces away from the carrier 100, that is, the first side 201 of the device chip 20 is exposed, thereby facilitating subsequent electrical connection between the device chip 20 and an external circuit or other interconnection structures.

In an exemplary form, the second side 202 of the device chip 20 can be attached to the carrier 100 by temporary bonding, so as to reduce the difficulty in subsequent removal of the carrier 100.

Figure 5:
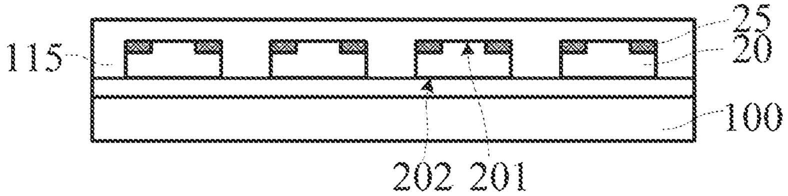
Figure 6:
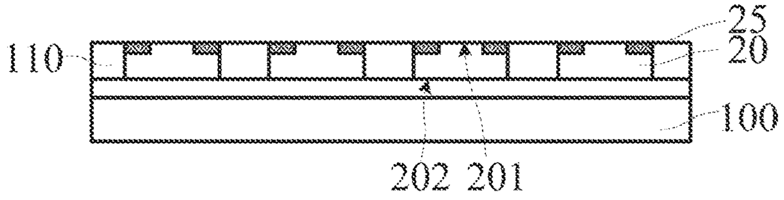

Referring to FIG. 5 to FIG. 6, a first packaging layer 110 covering a side wall of the device chip 20 and filling between the device chips 20 is formed on the carrier 100. The first packaging layer 110 exposes the first side 201 of the device chip 20.

The first packaging layer 110 is configured to realize packaging and integration between the plurality of device chips 20. The first packaging layer 110 can also play roles of insulation, sealing and moisture prevention, which is beneficial to improve the reliability of the packaging structure.

The first packaging layer 110 exposes the first side 201 of the device chip 20, so as to realize electrical connection between the device chip 20 and an external circuit or other interconnection structures.

In a form, a material of the first packaging layer 110 is a molding material, for example, epoxy resin. The epoxy resin has the advantages of low shrinkage, good binding property, good corrosion resistance, excellent electrical properties, low cost, etc. In other forms, the first packaging layer may be made of other appropriate packaging materials.

In an example, the step of forming the first packaging layer 110 includes: as shown in FIG. 5, a first packaging material layer 115 covering a top and the side wall of the device chip 20 is formed on the carrier 100; and the first packaging material layer 115 higher than the first side 201 of the device chip 20 is removed, and the remaining first packaging material layer 115 covering the side wall of the device chip 20 is used as the first packaging layer 110.

In an example, the first packaging material layer 115 may be formed by a molding process. In other forms, the first packaging material layer may also be formed by other appropriate processes based on actual process demands.

In an example, the first packaging material layer 115 higher than the first side 201 of the device chip 20 is removed by a grinding process to improve the flatness of the top surface of the first packaging material layer 115, thereby facilitating subsequent process.

Figure 7:

Referring to FIG. 7, an interconnect chip 10 is provided. A second interconnection structure 15 is formed on the interconnect chip 10, and the second interconnection structure 15 exposes a surface of the interconnect chip 10.

The interconnect chip 10 is provided, so that the interconnect chip 10 is bonded to the device chip 20 subsequently, thereby realizing interconnection between the device chips 20.

Specifically, the interconnect chip 10 is used as a bridge to realize interconnection between the device chip 20 and the device chip 20. In this form, the plurality of device chips 20 include different types of device chips 20, so that the interconnect chip 10 can provide heterogeneous chip packaging.

The second interconnection structure 15 is used as an external electrode of the interconnect chip 10 to realize electrical connection between the interconnect chip 10 and an external circuit or other interconnection structures. In an example, the second interconnection structure 15 is configured to realize electrical connection between the interconnect chip 10 and the device chip 20.

The second interconnection structure 15 is exposed from the surface of the interconnect chip 10, so as to realize electrical connection with an external circuit or other interconnection structures.

In this form, a second dielectric layer (not shown) is formed on the interconnect chip 10, and a second top layer line (not shown) is formed in the second dielectric layer; and the second interconnection structure 15 runs through the second dielectric layer above the second top layer line and contacts the second top layer line.

In this form, the second interconnection structure 15 may be a conductive plug running through the second dielectric layer above the second top layer line, one end of the conductive plug contacts the second top layer line, and the other end is exposed from the interconnect chip 10, which facilitates bonding to the first interconnection structure 25 and realizes electrical connection.

Alternatively, in other forms, a second dielectric layer is formed on the interconnect chip, and a second pad is formed in the second dielectric layer; and the second interconnection structure is located in the second dielectric layer on a top of the second pad.

In some other forms, based on the actual process demands, the second interconnection structure may also be other types of interconnection structures in the interconnect chip. For example, the second interconnection structure may be the second pad.

In an example, a material of the second interconnection structure 15 is a metal, including any one or more of copper, titanium, aluminum, gold, nickel, iron, tin, silver, zinc or chromium, which is beneficial to obtain good electrical conductivity.

In an example, the material of the second interconnection structure 15 is copper. Copper expands when heated, thereby facilitating contact and bonding with the first interconnection structure 25.

Figure 8:
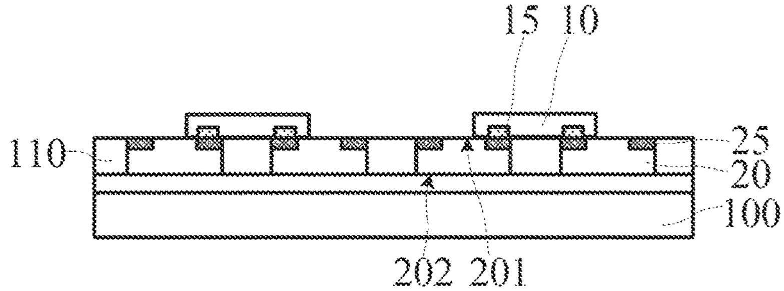

Referring to FIG. 8, the interconnect chip 10 is bonded to the device chip 20 and the first packaging layer 110. The second interconnection structure 15 of the interconnect chip 10 faces and contacts the first interconnection structure 25 of the adjacent device chip 20.

The interconnect chip 10 is bonded to the device chip 20 and the first packaging layer 110, so that the interconnect chip 10 is used as the bridge to realize interconnection between the device chip 20 and the device chip 20.

In this form, the second interconnection structure 15 of the interconnect chip 10 faces and contacts the first interconnection structure 25 of the adjacent device chip 20, so that the device chips 20 are electrically connected through the interconnect chip 10. Moreover, the second interconnection structure 15 of the interconnect chip 10 faces and contacts the first interconnection structure 25 of the adjacent device chip 20, which is beneficial to reduce the distance between the interconnect chip 10 and the device chip 20, thereby being beneficial to reduce the pitch between interconnect ports of the interconnect chip 10 and the device chip 20 and accordingly increasing the interconnection density and communication speed between the interconnect chip 10 and the device chip 20.

Specifically, in this form, the second interconnection structure 15 of the interconnect chip 10 faces and contacts the first interconnection structure 25 of the adjacent device chip 20, so that the electrical connection between the first interconnection structure 25 and the second first interconnection structure 15 is realized without other interconnection structures, which is beneficial to reduce the distance between the interconnect chip 10 and the device chip 20.

Specifically, in this form, the number of the second interconnection structures 15 of the interconnect chip 10 is at least two, one of the second interconnection structures 15 faces and contacts the first interconnection structure 25 of one of the device chips 20, and the other second interconnection structure 15 faces and contacts the first interconnection structure 25 of one adjacent device chip 20, thereby realizing electrical connection between the adjacent device chips 20.

In this form, the second interconnection structure 15 of the interconnect chip 10 faces and is bonded to the first interconnection structure 25 of the device chip 20, and the second dielectric layer of the interconnect chip 10 faces and is bonded to the first packaging layer and the first dielectric layer of the device chip 20, thereby realizing hybrid bonding. With the hybrid bonding, there is no need for bumps, which can further reduce the interconnection pitch of bonding, thereby realizing high-density integration.

Figure 9:
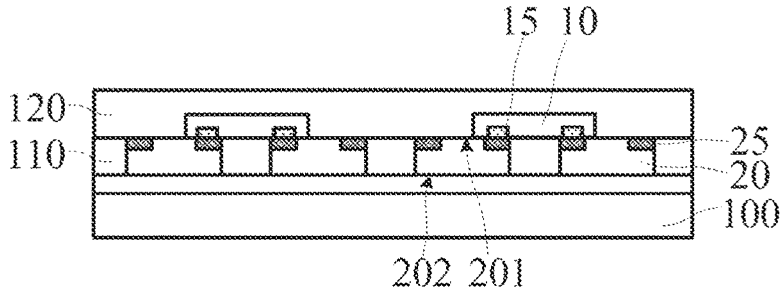

Referring to FIG. 9, a second packaging layer 120 covering the interconnect chip 10 is formed on the first packaging layer 110. The second packaging layer 120 is configured to realize packaging and integration between the interconnect chip 10, and the device chip 20 and first packaging layer 110, and can also play roles of insulation, sealing and moisture prevention, which is beneficial to improve the reliability of the packaging structure.

In a form, a material of the second packaging layer 120 is a molding material, for example, epoxy resin. The epoxy resin has the advantages of low shrinkage, good binding property, good corrosion resistance, excellent electrical properties, low cost, etc. In other forms, the second packaging layer may be made of other appropriate packaging materials.

In an example, the second packaging layer 120 is formed by a molding process. In other forms, the second packaging layer may also be formed by other appropriate processes based on actual process demands.

Figure 10:
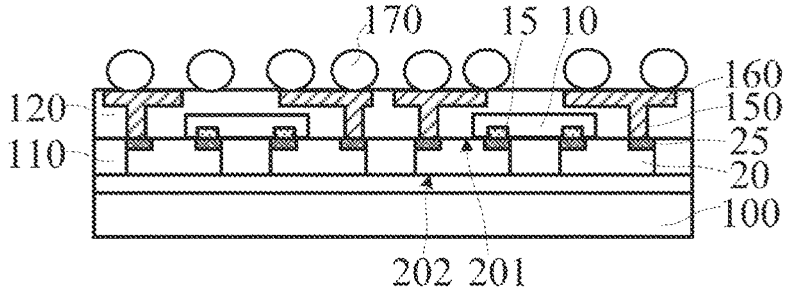

It should be noted that referring to FIG. 10, in this form, after forming the second packaging layer 120, the packaging method further includes: forming a via interconnection structure 160 running through the second packaging layer 120 and electrically connected to the device chip 20.

The via interconnection structure 150 is configured to realize electrical connection between the chip 20 and an external circuit or other interconnection structures.

In this form, the via interconnection structure 150 is a through molding via (TMV).

In this form, the number of the first interconnection structures 25 in the device chip 20 is plural; and the via interconnection structure 150 runs through the second packaging layer 120 on a top of the first interconnection structure 25 exposed by the interconnect chip 10 and contacts the first interconnection structure 25.

In this form, a material of the via interconnection structure 150 is a conductive material. More specifically, the material of the via interconnection structure 150 is a metal, including any one or more of copper, titanium, aluminum, gold, nickel, iron, tin, silver, zinc or chromium, which is beneficial to obtain good electrical conductivity.

In this form, in the step of forming the via interconnection structure 150, a connection layer 160 is further formed in the second packaging layer 120 on a top of the via interconnection structure 150. The connection layer 160 extends along a direction parallel to the second packaging layer 120. The packaging method further includes: after forming the via interconnection structure 150 and the connection layer 160, a conductive bump 170 is formed on the connection layer 160.

In this form, the connection layer 160 is configured to realize electrical connection between the via interconnection structure 150 and an external circuit or other interconnection structures, thereby realizing electrical connection between the device chip 20 and the external circuit through the via interconnection structure 150. In this form, the connection layer 160 is also configured to provide a process platform for the formation of the conductive bump 170.

In an example, the connection layer 160 and the via interconnection structure 150 are formed in the same step, and the connection layer 160 and the via interconnection structure 150 form an integrated structure, which is beneficial to reduce contact resistance between the connection layer 160 and the via interconnection structure 150 and improve the electrical connection performance of the packaging structure.

More specifically, a material of the connection layer 160 is a metal, including any one or more of copper, titanium, aluminum, gold, nickel, iron, tin, silver, zinc or chromium.

In an example, the step of forming the via interconnection structure 150 and the connection layer 160 includes: a via running through the second packaging layer 120 and an interconnect trench running through the second packaging layer 120 above the via and extending along the direction parallel to the second packaging layer are formed; and the via and the interconnect trench are filled to form the via interconnection structure located in the via and the connection layer 160 located in the interconnect trench.

The conductive bump 170 is configured to realize electrical connection between the connection layer 160 and an external circuit (e.g., a substrate).

In this form, the conductive bump 170 is a solder ball. In an example, a material of the solder ball includes tin.

Specifically, the solder ball is Controlled Collapse Chip Connection (C4), and has excellent electrical properties and thermal characteristics. Moreover, in a case of the same pitch between the solder balls, the I/O number can be very high, and not limited by the size of the connection layer 160. Besides, the solder ball is suitable for mass production, and the size and weight can be greatly reduced.

In other implementations, after forming the via interconnection structure, the packaging method further includes: forming a redistribution structure on the second packaging layer and the via interconnection structure; and forming a conductive bump on the redistribution structure.

The redistribution structure is configured to realize electrical connection between the via interconnection structure and an external circuit or other interconnection structures, thereby realizing electrical connection between the chip and the external circuit through the via interconnection structure. In addition, the redistribution structure can also redistribute connecting terminals of the via interconnection structure, so that the conductive bumps, of which density and positions satisfy the process demands, can be formed. In this form, the redistribution structure is also configured to provide a process platform for the formation of the conductive bump.

Specifically, the redistribution structure may include one or more redistribution layers.

Specifically, a material of the redistribution structure is a conductive material. More specifically, the material of the redistribution structure is a metal, including any one or more of copper, titanium, aluminum, gold, nickel, iron, tin, silver, zinc or chromium.

Figure 11:
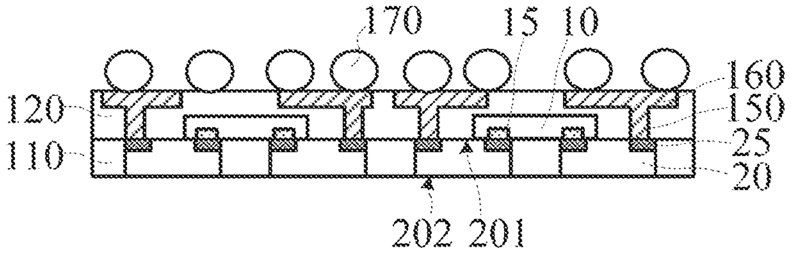

Referring to FIG. 11, it should be noted that in this form, after forming the second packaging layer 140, the carrier 100 is removed. The carrier 100 is removed, thereby exposing the surface of the first packaging layer 110 facing away from the interconnect chip 10 and the second side 20 of the device chip 20, and facilitating subsequent electrical connection between the conductive bump 170 and the external circuit (e.g., PCB).

More specifically, in this form, after forming the conductive bump 170, the carrier 100 is removed.

In an example, the carrier 100 may be removed by debonding, thereby reducing the difficulty in removal of the carrier 100.

In the packaging method provided by this form, the interconnect chip 10 is bonded to the device chip 20 and the first packaging layer 110, and the second interconnection structure 15 of the interconnect chip 10 faces and contacts the first interconnection structure 25 of the adjacent device chip 20, so that the device chips 20 are electrically connected through the interconnect chip 10. Moreover, the second interconnection structure 15 of the interconnect chip 10 faces and contacts the first interconnection structure 25 of the adjacent device chip 20, which is beneficial to reduce the distance between the interconnect chip 10 and the device chip 20, thereby being beneficial to reduce the pitch between interconnect ports of the interconnect chip 10 and the device chip 20 and accordingly increasing the interconnection density and communication speed between the interconnect chip 10 and the device chip 20. In addition, in this form, the process steps of attaching the device chip 20, forming the first packaging layer 110, bonding the interconnect chip 10 and forming the second packaging layer 120 are all performed on the carrier, so that the process steps of this form are simple. Moreover, only one carrier is needed, which is beneficial to save the process cost.

Although the disclosure has been described above, the disclosure is not limited thereto. Any person skilled in the art can make various changes and modifications without departing from the spirit and scope of the disclosure, so the scope of protection of the disclosure shall be subject to the scope defined by the claims.

What is claimed is:

1. A packaging structure, comprising:

a plurality of device chips, where a device chip of the plurality of device chips comprises a first side and a second side facing away from the first side, and a first interconnection structure being formed on the first side of the device chip;

a first packaging layer, covering a side wall of the device chip and filling between device chips of the plurality of device chips, the first packaging layer exposing the first side of the device chip;

an interconnect chip, bonded to the device chip and the first packaging layer, a second interconnection structure being formed on the interconnect chip, the second interconnection structure being exposed from a surface of the interconnect chip, and the second interconnection structure of the interconnect chip facing and contacting the first interconnection structure of the device chip; and a second packaging layer, located on the first packaging layer and covering the interconnect chip.

2. The packaging structure according to claim 1, wherein the first side is a front side of the device chip, and the second side is a back side of the device chip.

3. The packaging structure according to claim 1, wherein a plurality of first interconnection structures being formed in the device chip.

4. The packaging structure according to claim 1, wherein the packaging structure further comprises:

a via interconnection structure, running through the second packaging layer and electrically connected to the device chip.

5. The packaging structure according to claim 4, wherein another first interconnection structure is formed on the device chip, and a via interconnection structure runs through the second packaging layer on a top of the another first interconnection structure exposed by the interconnect chip and contacts the another first interconnection structure.

6. The packaging structure according to claim 5, wherein the packaging structure further comprises:

a connection layer, located in the second packaging layer on a top of the via interconnection structure and extending along a direction parallel to the second packaging layer; and a conductive bump, located on the connection layer.

7. The packaging structure according to claim 5, wherein the packaging structure further comprises:

a redistribution structure, located on the second packaging layer and the via interconnection structure; and a conductive bump, located on the redistribution structure.

8. The packaging structure according to claim 7, wherein the redistribution structure comprises one or more redistribution layers.

9. The packaging structure according to claim 1, wherein a first dielectric layer is formed on the first side of the device chip, a first top layer line is formed in the first dielectric layer, and the first interconnection structure runs through the first dielectric layer above the first top layer line and contacts the first top layer line.

10. The packaging structure according to claim 1, wherein a first dielectric layer is formed on the first side of the device chip, a first pad is formed in the first dielectric layer, and the first interconnection structure is located in the first dielectric layer on a top of the first pad.

11. The packaging structure according to claim 1, wherein a second dielectric layer is formed on the interconnect chip, a second top layer line is formed in the second dielectric layer, and the second interconnection structure runs through the second dielectric layer above the second top layer line and contacts the second top layer line.

12. The packaging structure according to claim 1, wherein a second dielectric layer is formed on the interconnect chip, a second pad is formed in the second dielectric layer, and the second interconnection structure is located in the second dielectric layer on a top of the second pad.

13. The packaging structure according to claim 1, wherein a material of the first interconnection structure comprises at least one of copper, titanium, aluminum, gold, nickel, iron, tin, silver, zinc or chromium, and a material of the second interconnection structure comprises at least one of copper, titanium, aluminum, gold, nickel, iron, tin, silver, zinc or chromium.

* * * * *